United States Patent
Chan

(10) Patent No.: US 11,460,913 B2
(45) Date of Patent: *Oct. 4, 2022

(54) DIRECTED EMITTER/SENSOR FOR ELECTROMAGNETIC TRACKING IN AUGMENTED REALITY SYSTEMS

(71) Applicant: Magic Leap, Inc., Plantation, FL (US)

(72) Inventor: Richmond B. Chan, Arlington Heights, IL (US)

(73) Assignee: Magic Leap, Inc., Plantation, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 17/145,177

(22) Filed: Jan. 8, 2021

(65) Prior Publication Data

US 2021/0208672 A1 Jul. 8, 2021

Related U.S. Application Data

(63) Continuation of application No. 16/561,669, filed on Sep. 5, 2019, now Pat. No. 10,915,164.

(60) Provisional application No. 62/727,489, filed on Sep. 5, 2018.

(51) Int. Cl.
  *G06F 3/01* (2006.01)
  *G01B 7/004* (2006.01)

(52) U.S. Cl.
  CPC .......... *G06F 3/011* (2013.01); *G01B 7/004* (2013.01)

(58) Field of Classification Search
  CPC ....... G06F 3/011; G06F 3/0346; G01B 7/004; G01B 7/30; G01R 33/0011; G01R 33/0094; G01R 33/0206; G01R 33/028
  See application file for complete search history.

(56) References Cited

U.S. PATENT DOCUMENTS

| | | | |
|---|---|---|---|
| 6,819,507 B2 | 11/2004 | Minoura et al. | |
| 10,432,679 B2* | 10/2019 | Nakabo | G06T 13/40 |
| 10,514,754 B2* | 12/2019 | Tokubo | H04B 7/04 |
| 10,915,164 B2 | 2/2021 | Chan | |

(Continued)

FOREIGN PATENT DOCUMENTS

| WO | 2018118728 A2 | 6/2018 |
|---|---|---|
| WO | 2020051298 A1 | 3/2020 |

OTHER PUBLICATIONS

U.S. Appl. No. 16/561,669, "Non-Final Office Action", dated Jun. 18, 2020, 13 pages.

(Continued)

*Primary Examiner* — Liliana Cerullo
(74) *Attorney, Agent, or Firm* — Kilpatrick Townsend & Stockton LLP

(57) ABSTRACT

An electromagnetic tracking system includes a hand held controller including an electromagnetic emitter configured to generate an electromagnetic field characterized by an electromagnetic field pattern and a first electromagnetic reflector positioned adjacent the electromagnetic emitter and configured to form a modified electromagnetic field pattern. The electromagnetic tracking system also includes a head mounted augmented reality display including an electromagnetic sensor configured to sense the electromagnetic field and a second electromagnetic reflector adjacent to sensor configured to optimally sense electromagnetic field pattern in a region of interest.

13 Claims, 13 Drawing Sheets

(56) References Cited

U.S. PATENT DOCUMENTS

| | | |
|---|---|---|
| 2014/0080109 A1 | 3/2014 | Haseltine et al. |
| 2017/0199584 A1 | 7/2017 | Mallinson |
| 2017/0205903 A1 | 7/2017 | Miller et al. |
| 2017/0351094 A1 | 12/2017 | Poulos et al. |
| 2018/0053056 A1 | 2/2018 | Rabinovich et al. |
| 2018/0095529 A1 | 4/2018 | Tokubo |
| 2018/0210083 A1 | 7/2018 | Fasching et al. |
| 2018/0361232 A1* | 12/2018 | Mallinson ............... G06F 3/011 |
| 2019/0179146 A1* | 6/2019 | De Nardi ............... G06F 3/012 |
| 2020/0073486 A1 | 3/2020 | Chan |

OTHER PUBLICATIONS

U.S. Appl. No. 16/561,669, "Notice of Allowance", dated Oct. 9, 2020, 7 pages.

PCT/US2019/049696, "International Preliminary Report on Patentability", dated Mar. 18, 2021, 8 pages.

PCT/US2019/049696, "International Search Report and Written Opinion", dated Dec. 2, 2019, 9 pages.

Application No. EP19857137.4, Extended European Search Report, dated Oct. 8, 2021, 8 pages.

* cited by examiner

DIRECTED EMITTER/SENSOR FOR ELECTROMAGNETIC TRACKING IN AUGMENTED REALITY SYSTEMS

CROSS-REFERENCES TO RELATED APPLICATIONS

This application is a continuation of U.S. patent application Ser. No. 16/561,669, filed Sep. 5, 2019, now U.S. Pat. No. 10,915,164, issued Feb. 9, 2021, entitled "DIRECTED EMITTER/SENSOR FOR ELECTROMAGNETIC TRACKING IN AUGMENTED REALITY SYSTEMS," which is a non-provisional of and claims the benefit of priority to U.S. Provisional Patent Application No. 62/727,489, filed Sep. 5, 2018, entitled "DIRECTED EMITTER/SENSOR FOR ELECTROMAGNETIC TRACKING IN AUGMENTED REALITY SYSTEMS," the contents of which are hereby incorporated by reference in their entirety for all purposes.

BACKGROUND OF THE INVENTION

Modern computing and display technologies have facilitated the development of systems for so called "virtual reality" (VR) or "augmented reality" (AR) experiences, wherein digitally reproduced images or portions thereof are presented to a user in a manner wherein they seem to be, or may be perceived as, real. A VR scenario typically involves presentation of digital or virtual image information without transparency to other actual real-world visual input; an AR scenario typically involves presentation of digital or virtual image information as an augmentation to visualization of the actual real-world around the user.

Despite the progress made in these display technologies, there is a need in the art for improved methods and systems related to augmented reality systems, particularly, display systems.

SUMMARY OF THE INVENTION

The present disclosure relates to virtual reality and/or augmented reality imaging and visualization systems. The present disclosure relates generally to methods and systems related to electromagnetic tracking in virtual reality and/or in augmented reality systems. More particularly, embodiments of the present disclosure provide methods and systems for directing energy transmitted by an emitter (also referred to as a transmitter) and/or received by a sensor (also referred to as a receiver) to improve performance of localization processes. In some embodiments, a shaped electromagnetic (EM) reflector is utilized to modify emission patterns generated using an EM emitter/reception patterns received by an EM sensor. In some embodiments, unshaped EM patterns may be prone to distortion, which may affect its ability to determine position and orientation accurately. In some embodiments, a shaped EM field may minimize distortions and may increase field strength. As a result, field strength in a vicinity of the electromagnetic sensor is increased. Similarly, the receptive capability of the electromagnetic sensor in the direction of the electromagnetic emitter is increased. These modifications may result in improved localization information, improved efficiency in power consumption, reduction in EM distortion, as well as reduction in size of the electromagnetic emitter and/or electromagnetic sensor. The disclosure is applicable to a variety of applications in computer vision and image display systems.

According to an embodiment of the present invention, an electromagnetic tracking system is provided. The electromagnetic tracking system includes a hand held controller including an electromagnetic emitter configured to generate an electromagnetic field characterized by an electromagnetic field pattern and a first electromagnetic reflector positioned adjacent the electromagnetic emitter and configured to form a modified electromagnetic field pattern. The electromagnetic tracking system also includes a head mounted augmented reality display including an electromagnetic sensor configured to sense the electromagnetic field and a second electromagnetic reflector adjacent to the electromagnetic sensor configured to optimally sense electromagnetic field pattern in a region of interest.

According to a specific embodiment of the present invention, a method of operating an electromagnetic tracking system is provided. The method includes generating an electromagnetic field using an electromagnetic emitter and reflecting the electromagnetic field using a first electromagnetic reflector to form a modified electromagnetic field pattern. The method also includes reflecting a portion of the modified electromagnetic field pattern using a second electromagnetic reflector and sensing the reflected portion of the modified electromagnetic field pattern using an electromagnetic sensor adjacent the second electromagnetic reflector.

Numerous benefits are achieved by way of the present disclosure over conventional techniques. For example, embodiments of the present disclosure provide methods and systems that increase electromagnetic field strength in a predetermined manner. Accordingly, systems can achieve desired functionality while reducing transmit power, reducing component size, reducing or avoiding EM distortions, and the like. These and other embodiments of the disclosure along with many of its advantages and features are described in more detail in conjunction with the text below and attached figures.

DETAILED DESCRIPTION OF SPECIFIC EMBODIMENTS

In an augmented reality (AR) system, the AR system can be designed to be interactive with a user. As an example, the user may be provided with a hand held controller, also referred to as a totem, that the user can utilize to interact with the AR system. Accordingly, it is useful to be able to determine the position and orientation (e.g., 6 degrees of freedom (DOF) pose) of the totem with respect to other elements of the AR system, including a head-worn display system, also referred to as a headset or an AR headset, worn by the user.

One approach to achieve high precision localization may involve the use of an electromagnetic (EM) field for example, emitted by electromagnetic field emitters, coupled with electromagnetic field sensors that are strategically placed on the user's AR headset, belt pack, and/or other ancillary devices (e.g., totems, haptic devices, gaming instruments, etc.). Electromagnetic tracking systems typically include at least one electromagnetic field emitter (referred to generally as "emitter") and at least one electromagnetic field sensor (referred to generally as "sensor"). The emitter generates an electromagnetic field having a known spatial (and/or temporal) distribution in an environment of the user of the AR headset. The sensor measures the generated electromagnetic fields at the locations of the sensor. Based on these measurements and knowledge of the distribution of the generated electromagnetic field, a pose (e.g., a position and/or orientation) of the sensor relative to the emitter can be determined. Accordingly, the pose of an object to which the sensor and/or the emitter is attached can be determined. That is, the relative position of the sensor and the emitter may be determined.

Figure 1:
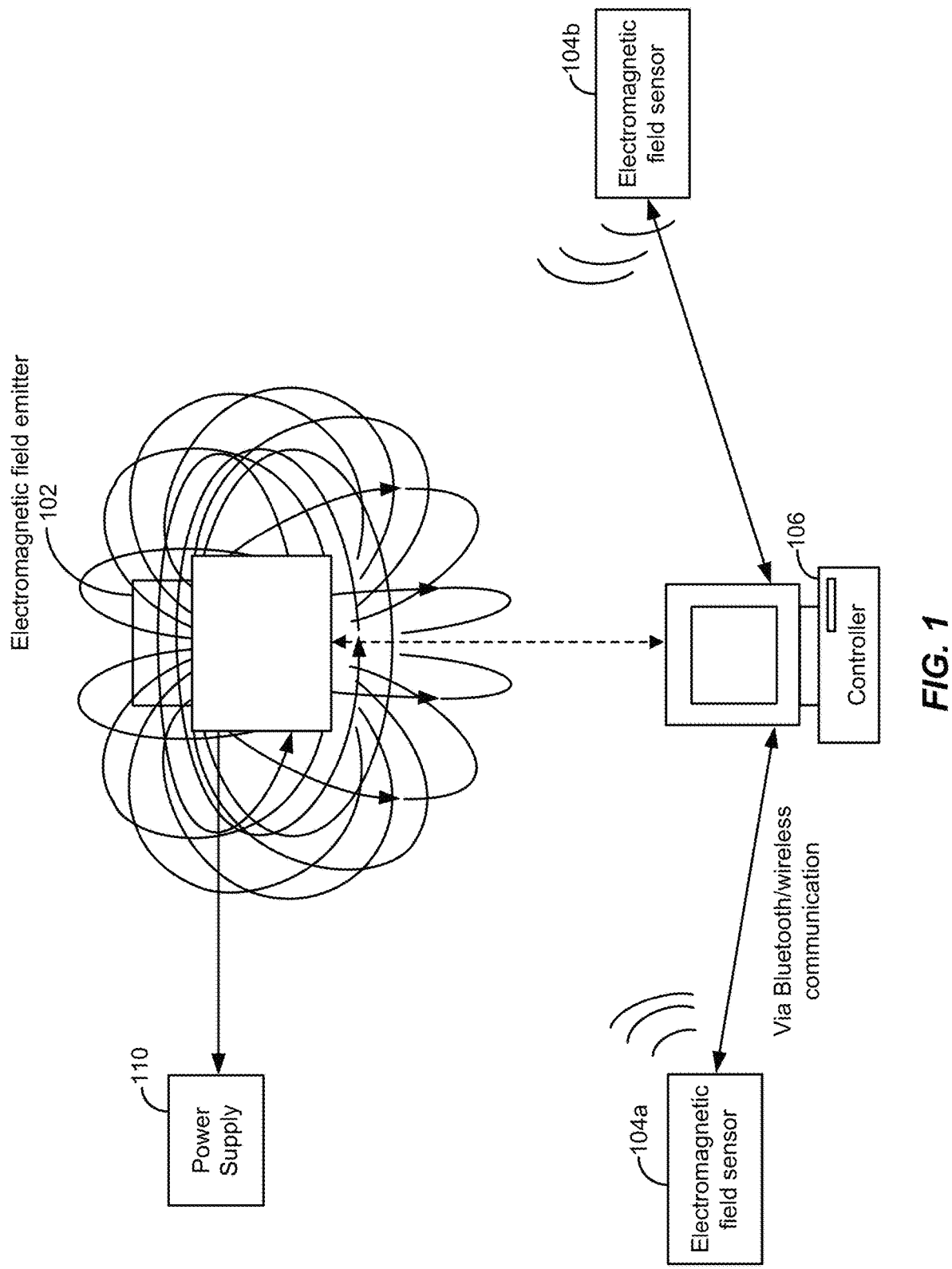
FIG. 1 schematically illustrates a system diagram of an electromagnetic (EM) tracking system, according to some embodiments.

Referring now to FIG. 1, an example system diagram of an electromagnetic tracking system is illustrated. In some embodiments, the electromagnetic tracking system includes one or more electromagnetic field emitters 102 (referred to generally as "emitter 102") that is configured to emit a known electromagnetic field. As shown in FIG. 1, the emitter 102 may be coupled to a power supply 110 (e.g., electric current, batteries, etc.) to provide power to the emitter 102.

In some embodiments, the emitter 102 includes several coils (e.g., at least three coils positioned perpendicular to each other to produce fields in the X, Y and Z directions) that generate electromagnetic fields. This electromagnetic field is used to establish a coordinate space (e.g., an X-Y-Z Cartesian coordinate space). This allows the system to map a position of electromagnetic sensors 104a, 104b (e.g., an (X,Y,Z) position) in relation to the known electromagnetic field, and determine a position and/or orientation of the electromagnetic sensors 104a, 104b. In some embodiments, the electromagnetic sensors 104a, 104b (referred to generally as "sensors" 104) may be attached to one or more real objects. The sensors 104 may include coils in which current may be induced through an electromagnetic field, for example, the electromagnetic field emitted by the emitter 102. The sensors 104 may include coils or loops (e.g., at least three coils positioned perpendicular to each other) coupled together within a small structure such as a cube or other container, that are positioned/oriented to capture incoming electromagnetic flux from the electromagnetic field, for example the electromagnetic field emitted by the emitter 102, and by comparing currents induced through these coils, and knowing the relative positioning and orientation of the coils relative to each other, relative position and orientation of the sensors 104 relative to the emitter 102 may be calculated.

Figure 3:
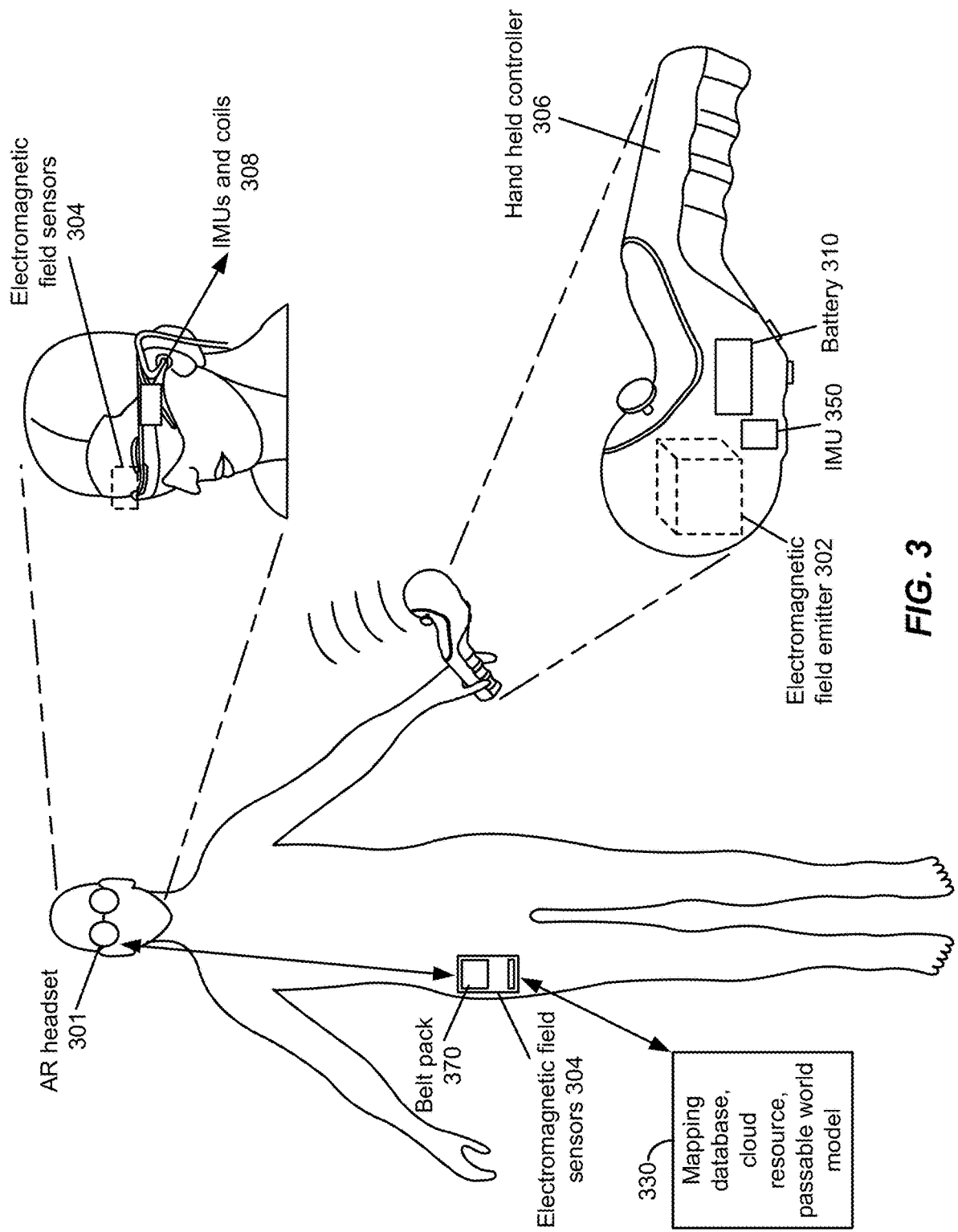
FIG. 3 schematically illustrates an electromagnetic tracking system incorporated with an augmented reality (AR) system, according to some embodiments.

One or more parameters pertaining to a behavior of the coils and inertial measurement unit ("IMU") components operatively coupled to the sensors 104 may be measured to detect a position and/or orientation of the sensors 104 (and the object to which it is attached to) relative to a coordinate system to which the emitter 102 is coupled. In some embodiments, multiple sensors 104 may be used in relation to the emitter 102 to detect a position and orientation of each of the sensors 104 within the coordinate space. The electromagnetic tracking system may provide positions in three directions (e.g., X, Y and Z directions), and further in two or three orientation angles. In some embodiments, measurements of the IMU may be compared to the measurements of the coil to determine a position and orientation of the sensors 104. In some embodiments, both electromagnetic (EM) data and IMU data, along with various other sources of data, such as cameras, depth sensors, and other sensors, may be combined to determine the position and orientation. This information may be transmitted (e.g., wireless communication, Bluetooth, etc.) to a controller 106. In some embodiments, pose (or position and orientation) may be reported at a relatively high refresh rate in conventional systems. Conventionally an electromagnetic field emitter is coupled to a relatively stable and large object, such as a table, operating table, wall, or ceiling, and one or more sensors are coupled to smaller objects, such as medical devices, handheld gaming components, or the like. Alternatively, as described below in reference to FIG. 3, various features of the electromagnetic tracking system may be employed to produce a configuration wherein changes or deltas in position and/or orientation between two objects that move in space relative to a more stable global coordinate system may be tracked; in other words, a configuration is shown in FIG. 3 wherein a variation of an electromagnetic tracking system may be utilized to track position and orientation delta (change) between a head-mounted component and a hand-held component, while head pose relative to the global coordinate system (say of the room environment local to the user) is determined otherwise, such as by simultaneous localization and mapping ("SLAM") techniques using outward-capturing cameras which may be coupled to the head mounted component of the system.

The controller 106 may control the emitter 102, and may also capture data from the sensors 104. It should be appreciated that the various components of the system may be coupled to each other through any electro-mechanical or wireless/Bluetooth means. The controller 106 may also include data regarding the known electromagnetic field, and the coordinate space in relation to the electromagnetic field. This information is then used to detect the position and orientation of the sensors 104 in relation to the coordinate space corresponding to the known electromagnetic field.

One advantage of electromagnetic tracking systems is that they produce high resolution, highly repeatable tracking results with minimal latency. Additionally, the electromagnetic tracking system does not necessarily rely on optical trackers, and sensors/objects not in the user's line-of-vision may be easily tracked.

It should be appreciated that the strength of the electromagnetic field, v, drops as a cubic function of distance, r, from a coil emitter (e.g., the emitter 102). Thus, an algorithm may be used based on a distance away from the emitter 102. The controller 106 may be configured with such algorithms to determine a position and orientation of the sensors 104 at varying distances away from the emitter 102. Given the rapid decline of the strength of the electromagnetic field as the sensors 104 move farther away from the emitter 102, best results, in terms of accuracy, efficiency and low latency, may be achieved at closer distances. In typical electromagnetic tracking systems, an emitter is powered by an electric current (e.g., plug-in power supply) and sensors are located within a 20 feet radius of the emitter. A shorter radius between the sensors and emitter may be more desirable in many applications, including AR applications.

Figure 2:
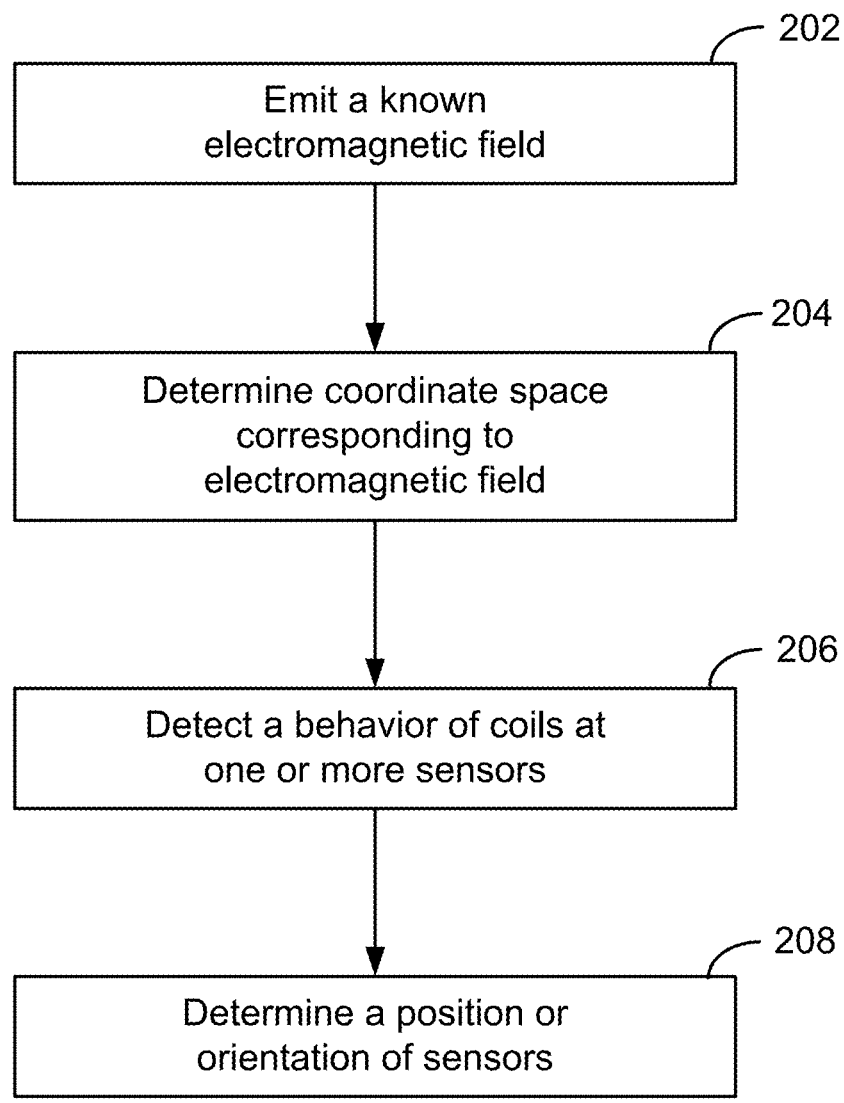
FIG. 2 is a flowchart describing functioning of an electromagnetic tracking system, according to some embodiments.

Referring now to FIG. 2, an example flowchart describing a functioning of an electromagnetic tracking system is briefly described, according to some embodiments. At 202, a known electromagnetic field is emitted. In some embodiments, an electromagnetic field emitter may generate electromagnetic fields. For example, each coil of the electromagnetic field emitter may generate an electromagnetic field in one direction (e.g., X, Y or Z). The electromagnetic fields may be generated with an arbitrary waveform. In some embodiments, the electromagnetic field component along each of the axes may oscillate at a slightly different frequency from other electromagnetic field components along other directions. At 204, a coordinate space corresponding to the electromagnetic field may optionally be determined. For example, a controller may automatically determine a coordinate space around the emitter and/or sensors based on the electromagnetic field. In some embodiments, the coordinate space may not be determined at this stage of the method. At 206, a behavior of coils at the sensors (which may be attached to a known object) may be detected. For example, a current induced at the coils may be calculated. In some embodiments, a rotation of coils, or any other quantifiable behavior may be tracked and measured. At 208, this behavior may be used to detect a position or orientation of the sensors and/or a known object (e.g., AR headset which includes the sensors) with respect to the emitter, or vice versa. For example, the controller 106 may consult a mapping table that correlates a behavior of the coils at the sensors to various positions or orientations. Based on these calculations, the position in the coordinate space along with the orientation of the sensors and/or emitters may be determined.

In the context of AR systems, one or more components of the electromagnetic tracking system may need to be modified to facilitate accurate tracking of mobile components (e.g., emitter and sensors). As described above, tracking a head pose of the user and orientation may be desirable in many AR applications. Accurate determination of the head pose and orientation of the user allows the AR system to display the appropriate/relevant virtual content to the user. For example, the virtual scene may include a virtual monster hiding behind a real building. Depending on the pose and orientation of the head of the user in relation to the building, the view of the virtual monster may need to be modified such that a realistic AR experience is provided. Or, a position and/or orientation of a totem, haptic device or some other means of interacting with virtual content may be important in enabling a user to interact with an AR system. For example, in many gaming applications, the AR system can detect a position and orientation of a real object in relation to virtual content. Or, when displaying a virtual interface, a position of a totem, a hand of a user, a haptic device or any other real object configured for interaction with the AR system can be known in relation to the displayed virtual interface in order for the system to understand a command, interaction, and the like. Some localization methods including optical tracking and other methods may be plagued with high latency and low resolution problems, which makes rendering virtual content challenging in many AR applications.

In some embodiments, the electromagnetic tracking system, discussed in relation to FIGS. 1 and 2 may be adapted to the AR system to detect position and orientation of one or more objects in relation to an emitted electromagnetic field. Typical electromagnetic tracking systems tend to have a large and bulky electromagnetic emitters (e.g., 102 in FIG. 1), which is problematic for head-mounted AR devices, for example, with a totem. However, smaller electromagnetic emitters (e.g., in the millimeter range) may be used to emit a known electromagnetic field in the context of the AR system.

Referring now to FIG. 3, an electromagnetic tracking system may be incorporated with an AR system as shown, with an electromagnetic field emitter 302 (referred to generally as "emitter 302") incorporated as part of a hand-held controller 306 (referred to generally as "controller 306"). The controller 306 can be movable independently relative to an AR headset 301 (or a belt pack 370). For example, the controller 306 can be held in a hand of a user, or the controller 306 could be mounted to a hand or arm of the user (e.g., as a ring or bracelet or as part of a glove worn by the user). In some embodiments, the controller 306 may be a totem, for example, to be used in a gaming scenario (e.g., a multi-degree-of-freedom controller) or to provide a rich user experience in an AR environment or to allow user interaction with an AR system. In some embodiments, the controller 306 may be a haptic device. In some embodiments, the emitter 302 may be incorporated as part of a belt pack 370. The controller 306 may include a battery 310 or other power supply that powers that emitter 302. It should be appreciated that the emitter 302 may also include or be coupled to an IMU 350 component configured to assist in determining positioning and/or orientation of the emitter 302 relative to other components. This may be especially advantageous in cases where both the emitter 302 and electromagnetic field sensors 304 (referred to generally as "sensors 304") are mobile. Placing the emitter 302 in the controller 306 rather than the belt pack 307, as shown in the embodiment of FIG. 3, helps ensure that the emitter 302 is not competing for resources at the belt pack 370, but rather uses its own battery source at the controller 306. In some embodiments, the emitter 302 can be disposed on the AR headset 301 and the sensors 304 can be disposed on the controller 306 or belt pack 370. Thus, embodiments of the present invention provide implementations in which the controller 306 is implemented as a hand-held unit, whereas in other embodiments, the controller is implemented in the AR headset 301, whereas in additional embodiments, the controller is implemented in an auxiliary unit, for example, belt pack 307. Moreover, in addition to implementations in which controller 306 is implemented in a single device, the functions of the controller and the attendant physical components can be distributed across multiple devices, for example, controller 306, AR headset 301, and/or an auxiliary unit such as belt pack 307.

In some embodiments, the sensors 304 may be placed on one or more locations on the AR headset 301, along with other sensing devices such as one or more IMUs or additional electromagnetic flux capturing coils 308. For example, as shown in FIG. 3, sensors 304, 308 may be placed on one or both sides of the AR headset 301. Since the sensors 304, 308 may be engineered to be rather small (and may be less sensitive, in some cases), having multiple sensors 304, 308 may improve efficiency and precision. In some embodiments, one or more sensors may also be placed on the belt pack 370 or any other part of the user's body. The sensors 304, 308 may communicate wirelessly, for example, through Bluetooth, to a computing apparatus that determines a pose and orientation of the sensors 304, 308 (and the AR headset 301 to which it is attached). In some embodiments, the computing apparatus may reside at the belt pack 370. In some embodiments, the computing apparatus may reside at the AR headset 301, or the controller 306. In some embodiments, the computing apparatus may in turn include a mapping database 330 (e.g., mapping database, cloud resources, passable world model, coordinate space, and the like) to detect pose, to determine the coordinates of real objects and/or virtual objects, and may even connect to cloud resources and the passable world model. The controller 306 is able, in an embodiment, to control timing of electromagnetic emission by the electromagnetic emitter and sensing by the electromagnetic sensor such that the position and orientation of the electromagnetic emitter and the electromagnetic sensor are computed based on the field from the modified electromagnetic field pattern. In some embodiments, a position and orientation of the electromagnetic emitter is computed relative to the electromagnetic sensor. In other embodiments, a position and orientation of the electromagnetic sensor is computed relative to the electromagnetic emitter. In some embodiments, a position and orientation of the electromagnetic emitter and the electromagnetic sensor are computed.

As described above, some electromagnetic emitters may be too bulky for AR devices. Therefore the emitter may be engineered to be compact using smaller components (e.g., coils) than traditional systems. However, given that the strength of the electromagnetic field decreases as a cubic function of the distance away from the emitter, a shorter radius between the sensors 304 and the emitter 302 (e.g., about 3 to 3.5 ft.) may reduce power consumption when compared to traditional systems such as the one detailed in FIG. 1.

In some embodiments, this aspect may either be utilized to prolong the life of the battery 310 that may power the controller 306 and the emitter 302, in one or more embodiments. In some embodiments, this aspect may be utilized to reduce the size of the coils generating the electromagnetic field at the emitter 302. However, in order to get the same strength of electromagnetic field, the power may be need to be increased. This allows for a compact emitter 302 that may fit compactly at the controller 306.

Several other changes may be made when using the electromagnetic tracking system for AR devices. Although this pose reporting rate is rather good, AR systems may require an even more efficient pose reporting rate. To this end, IMU-based pose tracking may (additionally or alternatively) be used. Advantageously, the IMUs may remain as stable as possible in order to increase an efficiency of the pose detection process. The IMUs may be engineered such that they remain stable up to 50-100 milliseconds. It should be appreciated that some embodiments may utilize an outside pose estimator module (e.g., IMUs may drift over time) that may enable pose updates to be reported at a rate of 10 to 20 Hz. By keeping the IMUs stable at a reasonable rate, the rate of pose updates may be dramatically decreased to 10 to 20 Hz (as compared to higher frequencies in traditional systems).

If the electromagnetic tracking system can be run at, for example, a 10% duty cycle (e.g., only pinging for ground truth every 100 milliseconds), the AR system may save power. This may mean that the electromagnetic tracking system wakes up every 10 milliseconds out of every 100 milliseconds to generate a pose estimate. This may directly translates to power consumption savings, which may, in turn, affect size, battery life and cost of the AR device (e.g., the AR headset 301 and/or the controller 306).

In some embodiments, this reduction in duty cycle may be strategically utilized by providing two controllers 306 (not shown) rather than just one controller 306 as illustrated in FIG. 3. For example, the user may be playing a game that requires two controllers 306, and the like. Or, in a multi-user game, two users may have their own controllers 306 to play the game. When two controllers 306 (e.g., symmetrical controllers for each hand) are used rather than one, the controllers 306 may operate at offset duty cycles. The same concept may also be applied to controllers 306 utilized by two different users playing a multiplayer game.

Figure 4:
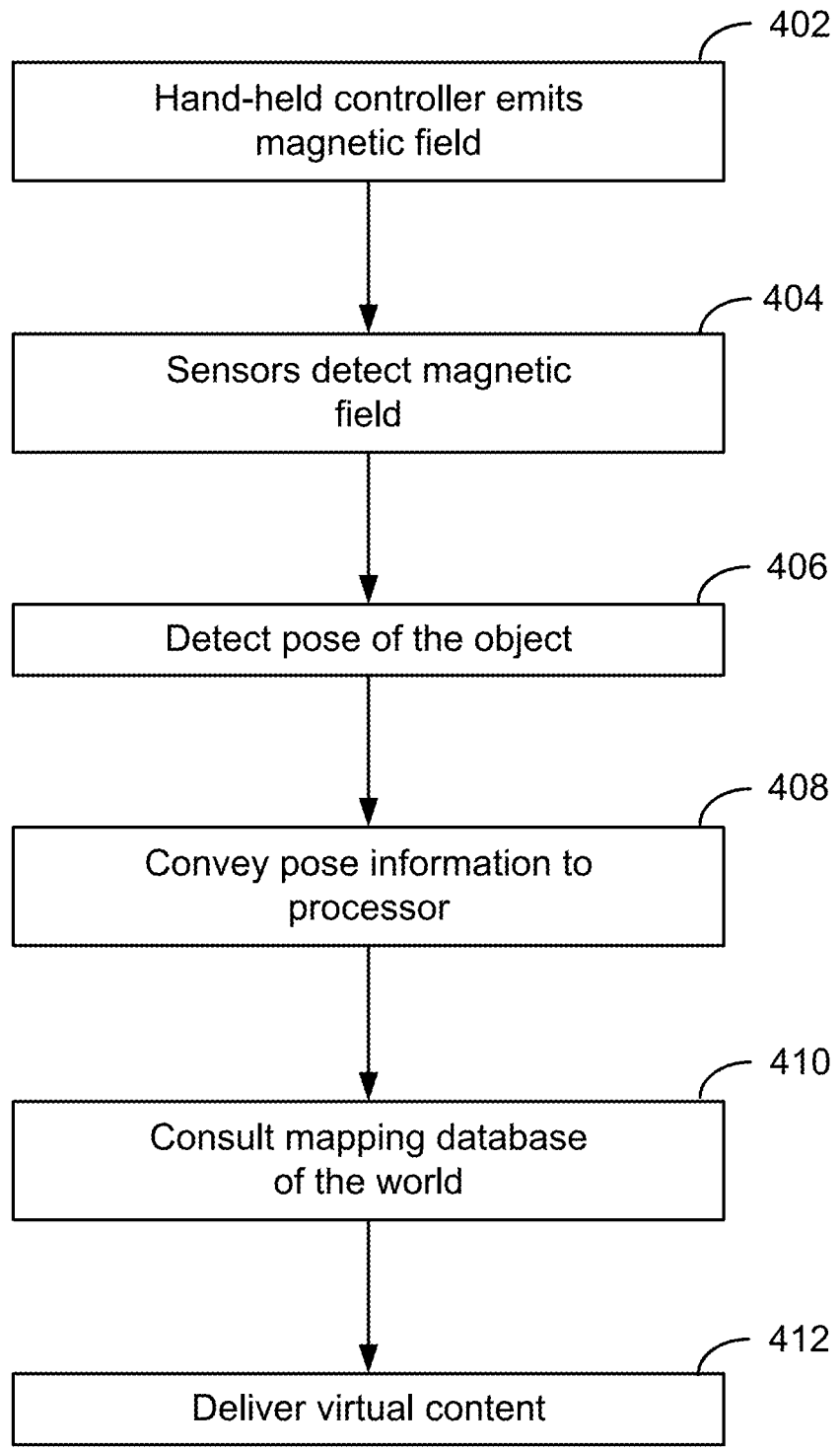
FIG. 4 is a flowchart describing functioning of an electromagnetic tracking system in the context of an AR device, according to some embodiments.

Referring now to FIG. 4, an example flowchart describing an electromagnetic tracking system in the context of AR devices is described. At 402, a portable (e.g., hand-held) controller (e.g., the controller 306) emits an electromagnetic field. For example, the emitter 302 emits the electromagnetic field. At 404, electromagnetic sensors (placed on headset, belt pack, etc.) detect the electromagnetic field. For example, the sensors 304, 308 detect the electromagnetic field. At 406, a pose (e.g., position or orientation) of an AR headset/a belt pack is determined based on a behavior of the coils/IMUs at the sensors. For example, the AR headset 301/the belt pack 370 determine a pose of the AR headset 301/the belt pack 370 based on the behavior of the sensors 304 and/or the IMUs and coils 308. At 408, the pose information is conveyed to the computing apparatus. For example, the pose information is conveyed to the computing apparatus in the AR headset 301 and/or the belt pack 370. At 410, optionally, a mapping database may be consulted to correlate real world coordinates (e.g., determined for the pose of the headset/belt) with virtual world coordinates. For example, the mapping database 330 may be consulted to correlate the real world coordinates with the virtual world coordinates. At 412, virtual content may be delivered to the AR headset and displayed to the user (e.g., via the light field displays described herein). For example, the virtual content may be delivered to the AR headset 301 and displayed to the user. It should be appreciated that the flowchart described above is for illustrative purposes only, and should not be read as limiting.

Advantageously, using an electromagnetic tracking system similar to the one outlined in FIG. 3 enables pose tracking (e.g., head position and orientation, position and orientation of totems, and other controllers). This allows the AR system to project virtual content (based at least in part on the determined pose) with a higher degree of accuracy, and very low latency when compared to optical tracking techniques. Further, this allows the AR system to track a user input device (e.g., the controller 306) with high accuracy, low power consumption (e.g., by the battery 210), low latency, and the like.

Figure 5:
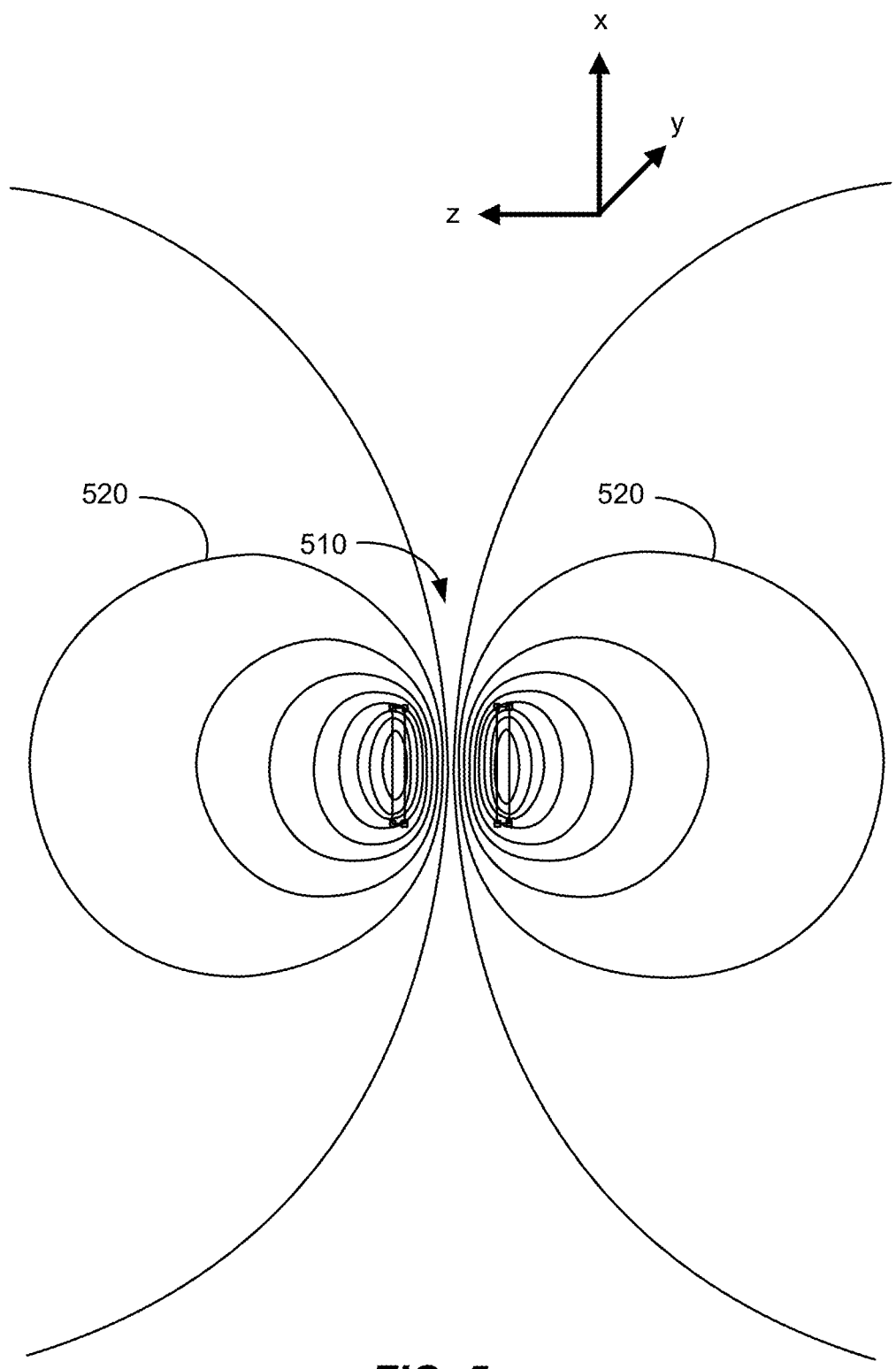
FIG. 5 is a plan view of an electromagnetic emitter and corresponding electromagnetic field lines, according to some embodiments

FIG. 5 is a plan view of an electromagnetic emitter and corresponding electromagnetic field lines, according to some embodiments. As illustrated in FIG. 5, electromagnetic field lines 520 emitted by an electromagnetic emitter 510 (referred to generally as "emitter 510") form closed loops that pass through the interior region of the emitter 510 along a x-direction, which is substantially parallel to the line connecting the poles created by the emitter 510. As illustrated in FIG. 5, the electromagnetic field generated by the emitter 510 extends equally in both the positive and negative z-directions.

As described above in relation to FIG. 3, during use, the electromagnetic field established by the emitter 510 (e.g., the emitter 302 in FIG. 3) will be detected at the sensors (e.g., the sensor 304 in FIG. 3)304 in order to provide the desired localization information. Because the transmitted electromagnetic fields extend away from the emitter 510 in both positive and negative z-directions, energy that is directed in a direction opposing the direction from the emitter 510 to the sensors will not be utilized, impairing system efficiency.

Figure 6:
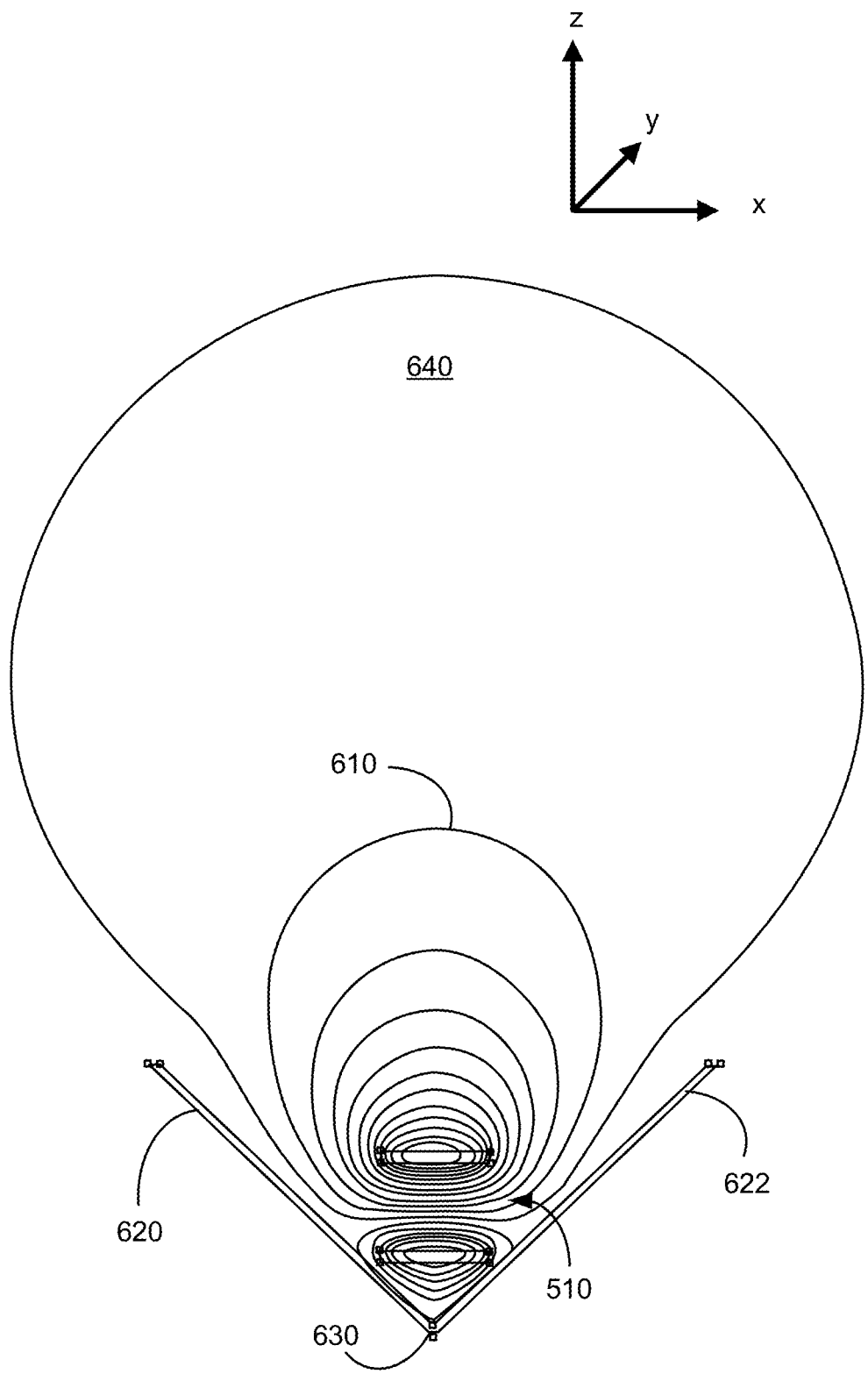
FIG. 6 is a plan view of an electromagnetic emitter incorporating a two-sided reflector and corresponding electromagnetic field lines, according to some embodiments.

In some embodiments, the diagrams of FIGS. 6-9 may be based on finite element analyses of time-varying electromagnetic fields. In some embodiment, addition of reflectors of various shapes and configurations at or near coils of an emitter and/or a sensor may increase intensity of electromagnetic lines from the emitter and/or at the sensor in a region of interest (ROI). The ROI may be where motion in an AR or VR system is mostly active. Although the description relates to emitters, similar reflectors may be applied to sensors to increase reception of sensors in the ROI. FIG. 6 is a plan view of an electromagnetic emitter incorporating a two-sided reflector and corresponding electromagnetic field lines, according to some embodiments. In FIG. 6, only electromagnetic field lines lying in the x-z plane are illustrated for the purpose of clarity, but it will be appreciated by one of skill in the art that a three-dimensional lobe pattern will be present. As discussed more fully below in relation to FIG. 8, the design illustrated in FIG. 6 can be extended into three dimensions.

Referring to FIG. 6, two reflective elements, a first reflective element 620 and a second reflective element 622 have been positioned adjacent the emitter 510, thereby providing an integrated electromagnetic reflector, also referred to as an integrated reflector. The emitter 510 is oriented such that the electromagnetic field passing thru the coils of the emitter are aligned with the x-axis. The first reflective element 620 is oriented at a predetermined angle, for example, an angle of 135°, with respect to the x-axis and the second reflective element 622 is oriented at a predetermined angle, for example, an angle of 45°, with respect to the x-axis. In other words, the first reflective element 620 is aligned with a diagonal having a slope of −1 measured in the x-z plane and the second reflective element 622 is aligned with a diagonal having a slope of +1 measured in the x-z plane. As illustrated in FIG. 6, the first reflective element 620 and the second reflective element 622 are joined at apex 630, positioned at a mid-point of the emitter 510.

The first reflective element 620 and the second reflective element 622 are fabricated using materials that are highly conductive at the frequencies at which the emitter 510 operates (e.g., 27 kHz-40 kHz, for instance, 35 kHz). In some embodiments, a highly conductive metallic plate, for example, a 2 mm thick copper plate, can be utilized to form the reflective elements 620, 622. In some embodiments, a substrate coated with a highly conductive material may be employed to utilize the mechanical properties of the substrate (e.g., plastic) in conjunction with the electrical properties of the conductive material coated onto the substrate. As will be evident to one of skill in the art, the materials utilized to fabricate first reflective element 620 and second reflective element 622 are applicable to other reflective elements described here as appropriate. One of ordinary skill in the art would recognize many variations, modifications, and alternatives.

Because the first reflective element 620 and the second reflective element 622 reflect the electromagnetic field that would have been established in the negative z-direction, electromagnetic field lines 610 form a single lobe oriented along the positive z-direction. As a result of the electromagnetic energy being present in the single lobe, an electromagnetic field sensor (e.g., the sensors 304) positioned along the positive z-axis with respect to the emitter 510 will detect a stronger electromagnetic field at a given distance from the emitter 510, thereby improving system performance.

Moreover, the electromagnetic field lines 610 are characterized by higher intensity fields for a given lobe width. Referring to FIG. 6, the presence of the reflective elements 620 and 622 results in compression of the electromagnetic field lines 610, thereby producing a higher intensity field. The width of the electromagnetic field line 610 characterized by half of a maximum field intensity is defined as a full width half maximum of the electromagnetic field. As illustrated in FIG. 6, for electromagnetic field line 610, which has intensity half of the maximum field intensity, the width is equal to W. Accordingly, the full width half maximum of the lobe pattern illustrated in FIG. 6, which can be referred to as a modified electromagnetic field pattern, is W. This can be compared to the electromagnetic field produced by the emitter in the absence of the first reflective element 620 and the second reflective element 622. Absent the reflective elements 620 and 622, the electromagnetic field lines 610 would extend over a large area and be characterized by a full width half maximum larger than W, which corresponds to a weaker intensity field in a ROI 640, as well as unwanted EM energy in the non-ROI areas. Accordingly, whereas a traditional electromagnetic field pattern generated by a traditional emitter would be characterized by an initial full width half maximum width, in some embodiments, utilizing reflective structures such as the reflective elements 620 and 622 will generate a modified electromagnetic field pattern that will be characterized by a modified full width half maximum width that is less than the initial full width half maximum width. In other words, the electromagnetic field lines in the ROI 640 have higher intensity fields. Referring to FIG. 6, the presence of the reflective elements 620 and 622 results in reflection of electromagnetic field lines in addition to original ones when the reflective elements 620 and 622 were not present. This, in effect, produces a modified field pattern with an intensity field much higher the original field in the ROI 640 without the reflective elements 620 and 622. This can be compared to the electromagnetic field produced by the emitter in the absence of the reflective elements 620, 622, which was illustrated in FIG. 5. Absent the reflective elements 620, 622, the electromagnetic field lines 610 would extend over a large area and the intensity of the field in the ROI 640 would be significantly reduced. Accordingly, whereas a traditional electromagnetic field pattern generated by a traditional emitter as shown in FIG. 5 would distribute its energy fields not only in the ROI 640, but also fields in non-ROI areas as shown in FIG. 5. Utilizing reflective elements such as the reflective elements 620 and 622 will generate a modified electromagnetic field pattern that will be concentrated in the ROI 640. In the modified pattern, distortions caused by metals in regions where electromagnetic lines are minimal would be at a minimum. Thus, the reflective elements 620 and 622 shield the coils of the emitter and the coils of the sensor from distortions caused by metals on the other side of the reflective elements 620 and 622. For such a configuration as shown in FIG. 6, as well as those on FIGS. 7-9, the controller 106 may be capable of computing the positions and orientations based on the modified field pattern.

Figure 7:
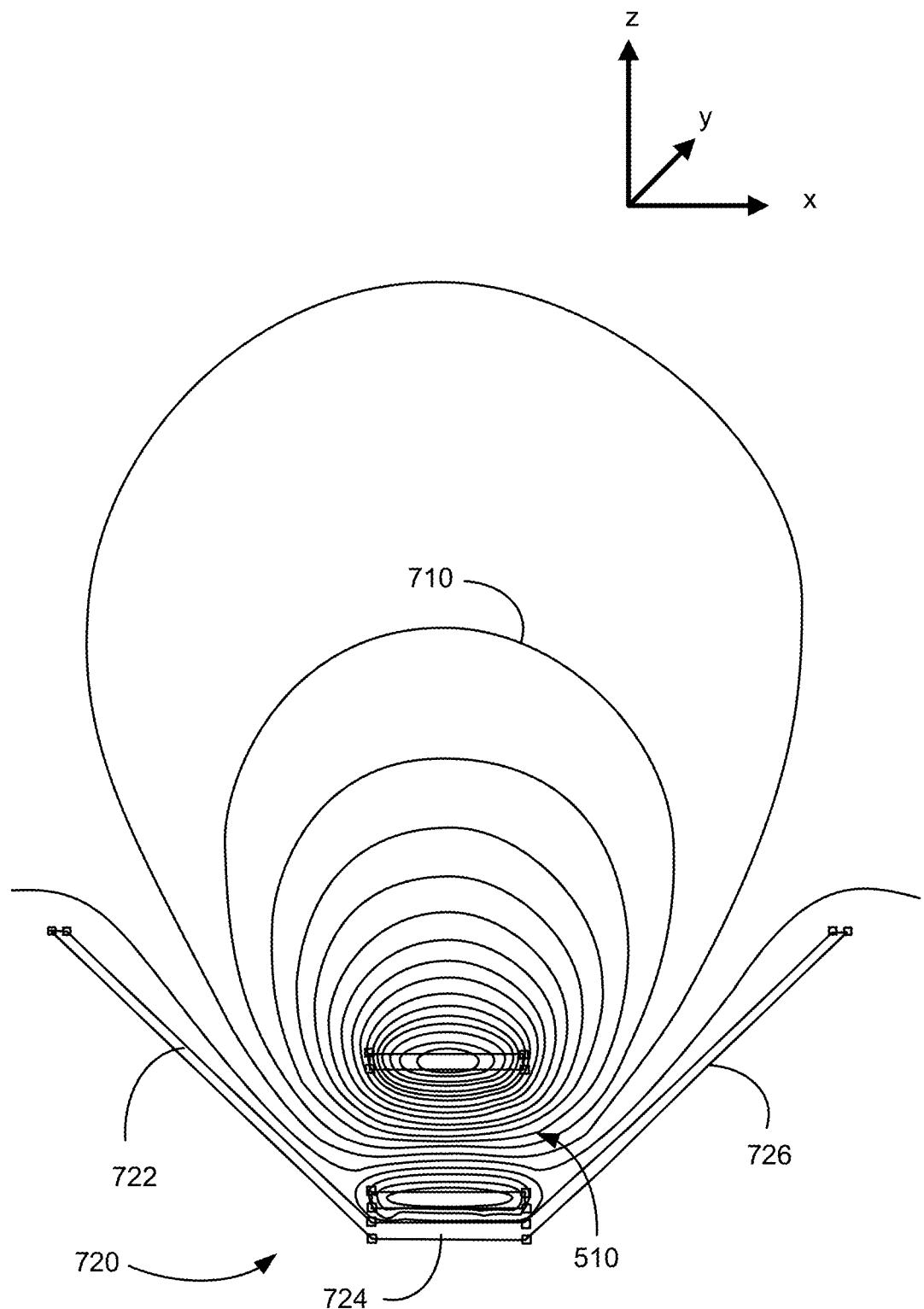
FIG. 7 is a plan view of an electromagnetic emitter incorporating a segmented reflector and corresponding electromagnetic field lines, according to some embodiments.

FIG. 7 is a plan view of an electromagnetic emitter incorporating a segmented reflector and corresponding electromagnetic field lines, according to some embodiments. A segmented reflector 720 is placed adjacent one side of the emitter 510. The segmented reflector 720 includes a first distal reflective element 722, a central reflective element 724, and a second distal reflective element 726. Because the elements of the segmented reflector 720 reflect the electromagnetic field that would have been established in the negative z-direction, electromagnetic field lines 710 form a single lobe oriented along the positive z-direction. The dimensions, for example, the length, of the reflective elements 720, 724, 726, as well as the angle between the first distal reflective element 722 and the central reflective element 724, as well as the angle between the second distal reflective element 726 and the central reflective element 724, can be selected to control the distribution of the electromagnetic field lines 710.

In some embodiments, the length of the central reflective element 724 is equal to the length of the emitter 510 in the x-direction and the angles between the distal reflective elements 722, 726 and the central reflective element 724 are both 45°. The length of the distal reflective elements 722, 726 can be selected as a function of the length of the central reflective element 724. As will be evident to one of skill in the art, increases in the length of the distal reflective elements 722, 726 can result in less electromagnetic field being present in the regions behind the distal reflective elements 722, 726 opposite the centerline of the electromagnetic field pattern. However, increases in the length of the distal reflective elements 722, 726 can result in increased system weight and cost. In a similar manner, the angles between the central reflective element 724 and the pair of distal reflective elements 722, 726 can be varied as appropriate to the particular application. Thus, although equal angles of 45° are illustrated in FIG. 7, embodiments are not limited to this implementation and configurations with other angles can also be utilized. Moreover, the angles do not have to be equal and can be different. One of ordinary skill in the art would recognize many variations, modifications, and alternatives.

Figure 8:
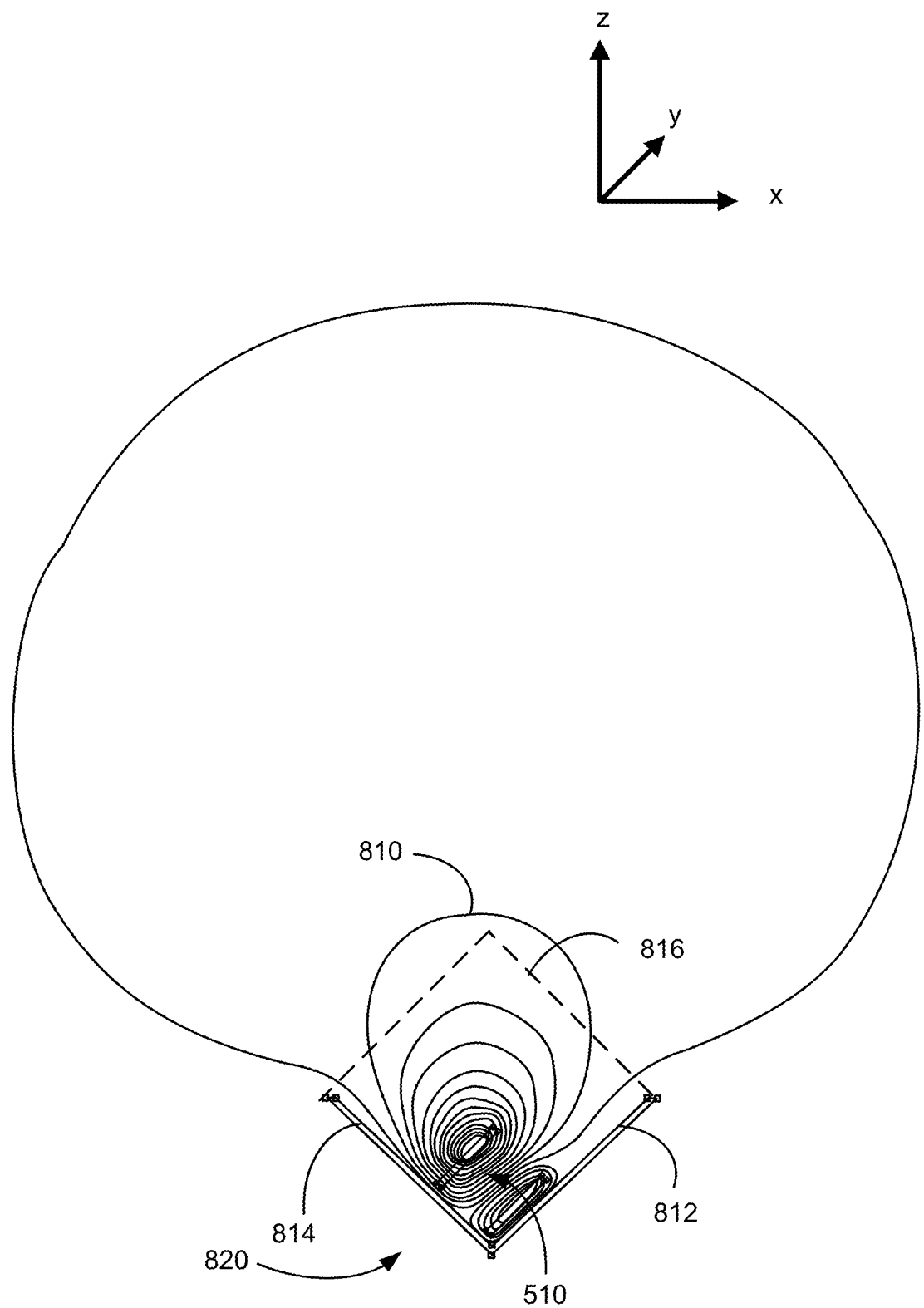
FIG. 8 is a plan view of an electromagnetic emitter incorporating a three-sided reflector and corresponding electromagnetic field lines, according to some embodiments.

FIG. 8 is a plan view of an electromagnetic emitter incorporating a three-sided reflector and corresponding electromagnetic field lines, according to some embodiments. In FIG. 8, only electromagnetic field lines lying in the x-z plane are illustrated for the purpose of clarity, but it will be appreciated by one of skill in the art that a three-dimensional lobe pattern will be present with the center of the lobe extending away from the electromagnetic emitter in a direction orthogonal to the x-axis and at an angle of 45° with respect to the x-z plane.

Referring to FIG. 8, three reflective elements are illustrated. A first reflective element 812 and a second reflective element 814 are positioned adjacent the emitter 510. A third reflective element 816, which lies in the x-z plane, is illustrated by dashed lines. In the embodiment illustrated in FIG. 8, the three reflective elements 812, 814, 816 are orthogonal to each other, forming one half of a cube structure, with the intersection of the three reflective elements forming the corner vertex of a cube. The emitter 510 is oriented at 45° with respect to the orientation illustrated in FIG. 6. Accordingly, the plates of the emitter 510 are oriented at 45° to the x-axis in this embodiment.

Because the first reflective element 620, the second reflective element 622, and the third reflective element 816 reflect the electromagnetic field that would have been established in the negative z-direction and the positive y-direction, the electromagnetic field lines 810 form a single lobe oriented out of the plane of the figure along the positive z-direction and the negative y-direction. In some embodiments, the presence of the reflective elements 812, 814, 816 in the half-cube configuration result in efficiency increases of up to a factor of eight and power consumption reductions by up to a factor of eight. Alternatively, the size of the emitter 510 can be reduced for a given efficiency/power consumption. Moreover, in some embodiments, the size of the emitter 510 is reduced while achieving improved efficiency/power consumption performance. One of ordinary skill in the art would recognize many variations, modifications, and alternatives.

Figure 9:
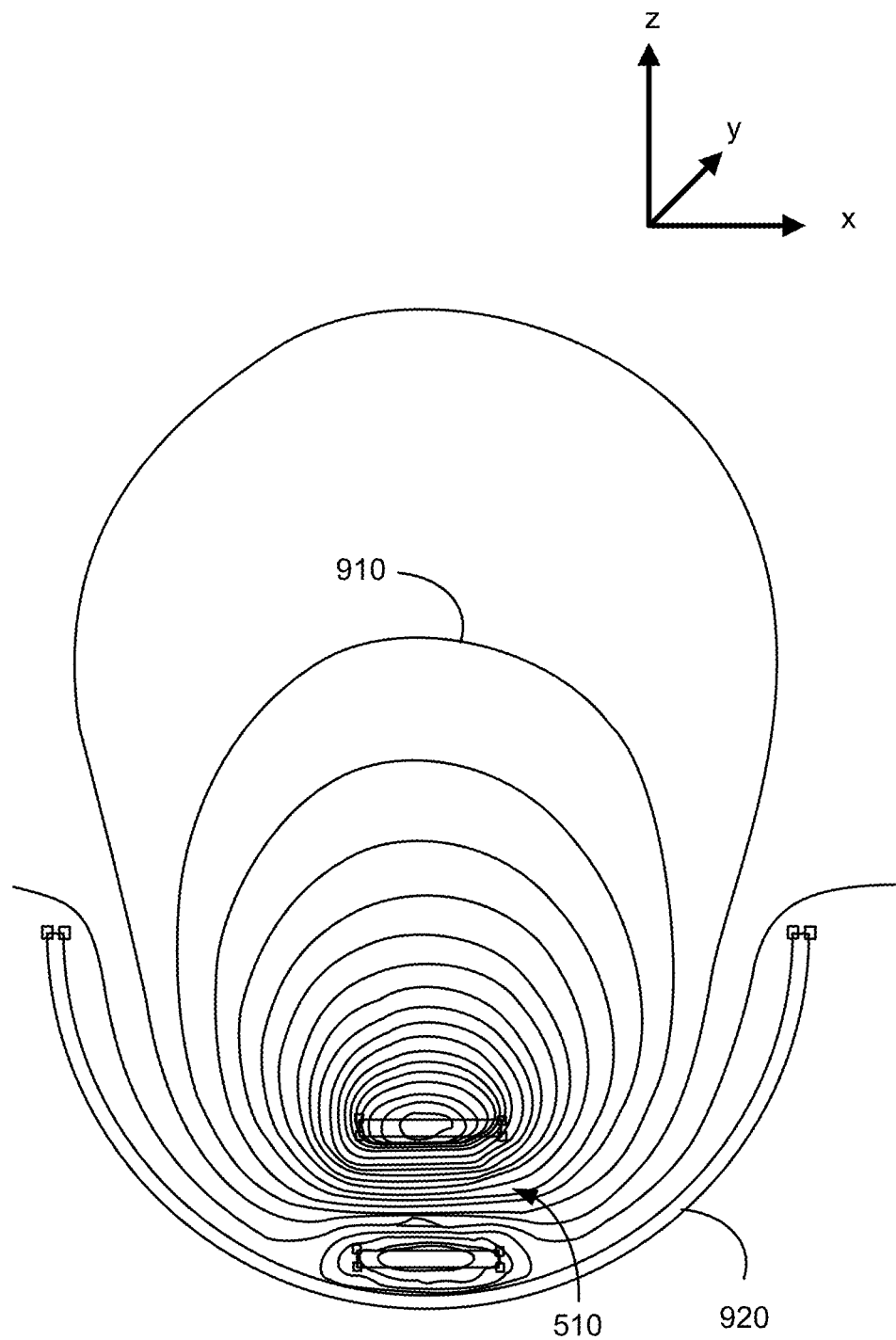
FIG. 9 is a plan view of an electromagnetic emitter incorporating a hemispherical reflector and corresponding electromagnetic field lines, according to some embodiments.

FIG. 9 is a plan view of an electromagnetic emitter incorporating a hemispherical reflector and corresponding electromagnetic field lines, according to some embodiments. In FIG. 9, a portion of a hemispherical reflector 920 lying in the x-z plane is illustrated as a circular arc. It will be appreciated that rotation of the illustrated circular arc around the z-axis will define the hemispherical shape of the hemispherical reflector. Because the hemispherical reflector 920 reflects the electromagnetic field that would have been established in the negative z-direction, electromagnetic field lines 910 form a single lobe oriented along the positive z-direction.

Figure 10A:
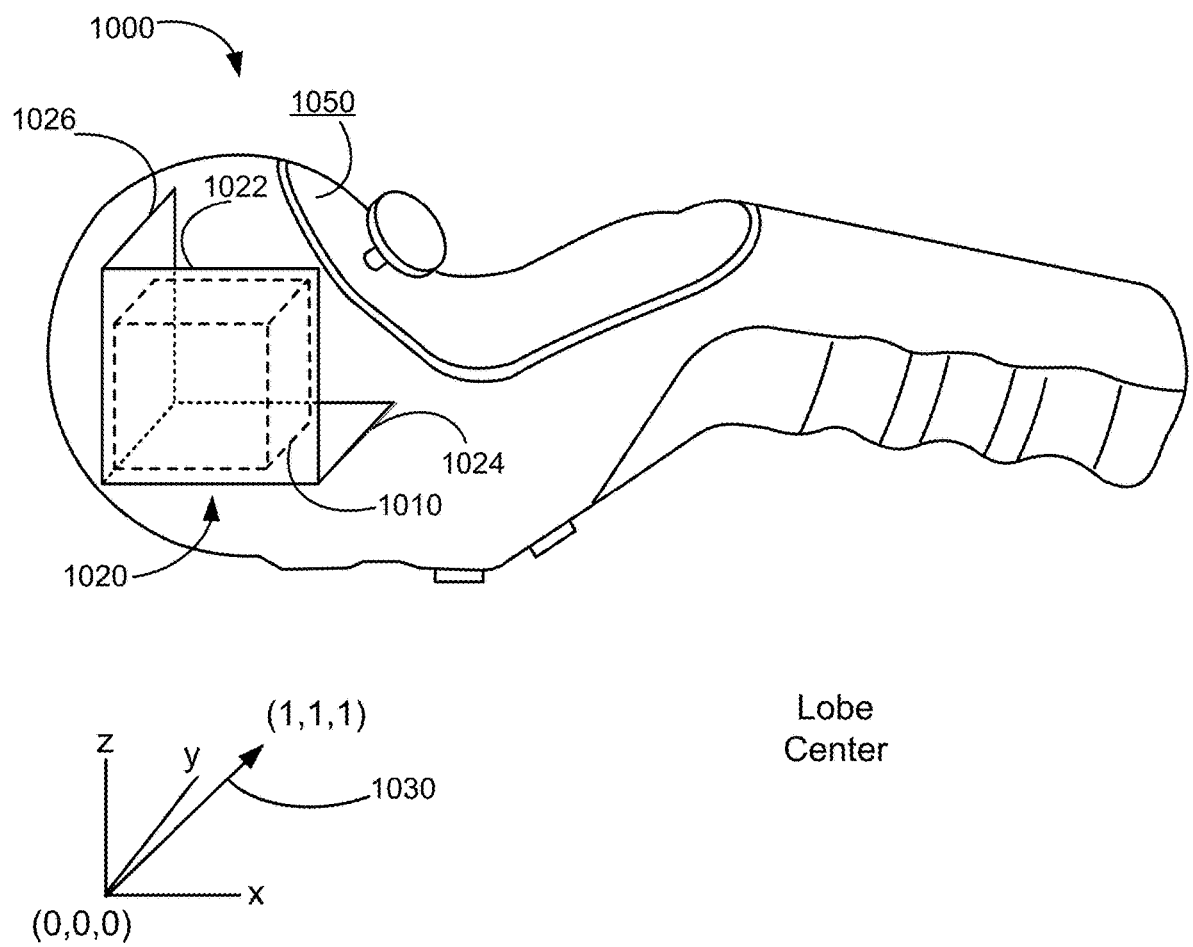
FIG. 10A is a perspective diagram illustrating integration of an electromagnetic emitter incorporating a three-sided reflector with a hand held controller, according to some embodiments.

FIG. 10A is a perspective diagram illustrating integration of an electromagnetic emitter incorporating a three-sided reflector with a hand held controller, according to some embodiments. Referring to FIG. 10A, a hand held controller 1000 includes an electromagnetic emitter 1010 (referred to generally as "emitter 1010") that is integrated with three-sided corner-cube reflector 1020. In this example, the three sides of the reflector lie in the following planes, respectively: first side 1022 in the x-z plane, second side 1024 in the x-y plane, and third side 1026 in the y-z plane. Reflection, by the three-sided corner-cube reflector 1020, of the electromagnetic field generated by the emitter 1010 results in a center of a three-dimensional lobe pattern produced by the emitter 1010 being aligned with vector 1030 that is aligned with a direction away from the intersection of the three reflector planes in the direction of a principal line equidistant to the three axes of the three-sided corner-cube reflector, where each axis corresponds to intersection of two reflectors. As illustrated in FIG. 10A, vector 1030 is directed from the origin of the x-y-z coordinate space along a line directed to point (1, 1, 1) in the x-y-z coordinate space, which corresponds to the center of the three-dimensional lobe pattern. When such a three sided corner-cube reflector is applied to the sensor, it would allow the sensor to sense most effectively along a principal line which would be pointed towards the ROI.

In typical use, the hand held controller 1000 is positioned in front of a user, with surface 1050 generally orthogonal to a line pointing toward the head of the user and an AR headset worn by the user. A line connecting the surface 1050 and the head of the user, as well as the normal to the surface 1050, is generally parallel to vector 1030. As a result, since the enhanced directionality of the electromagnetic field generated by the emitter 1010 produces stronger fields along the vector 1030, stronger fields are produced in the vicinity of the head of the user and the AR headset worn by the user. Similarly, as described in relation to FIG. 10B below, the headset can include a sensor with a corresponding three-side corner-cube reflector (or other suitable integrated reflectors as described herein) configured such that maximum reception would be in the ROI where the emitter is expected to be. As a result, improved system performance is provided in relation to implementations that do not utilize reflective elements.

Figure 10B:
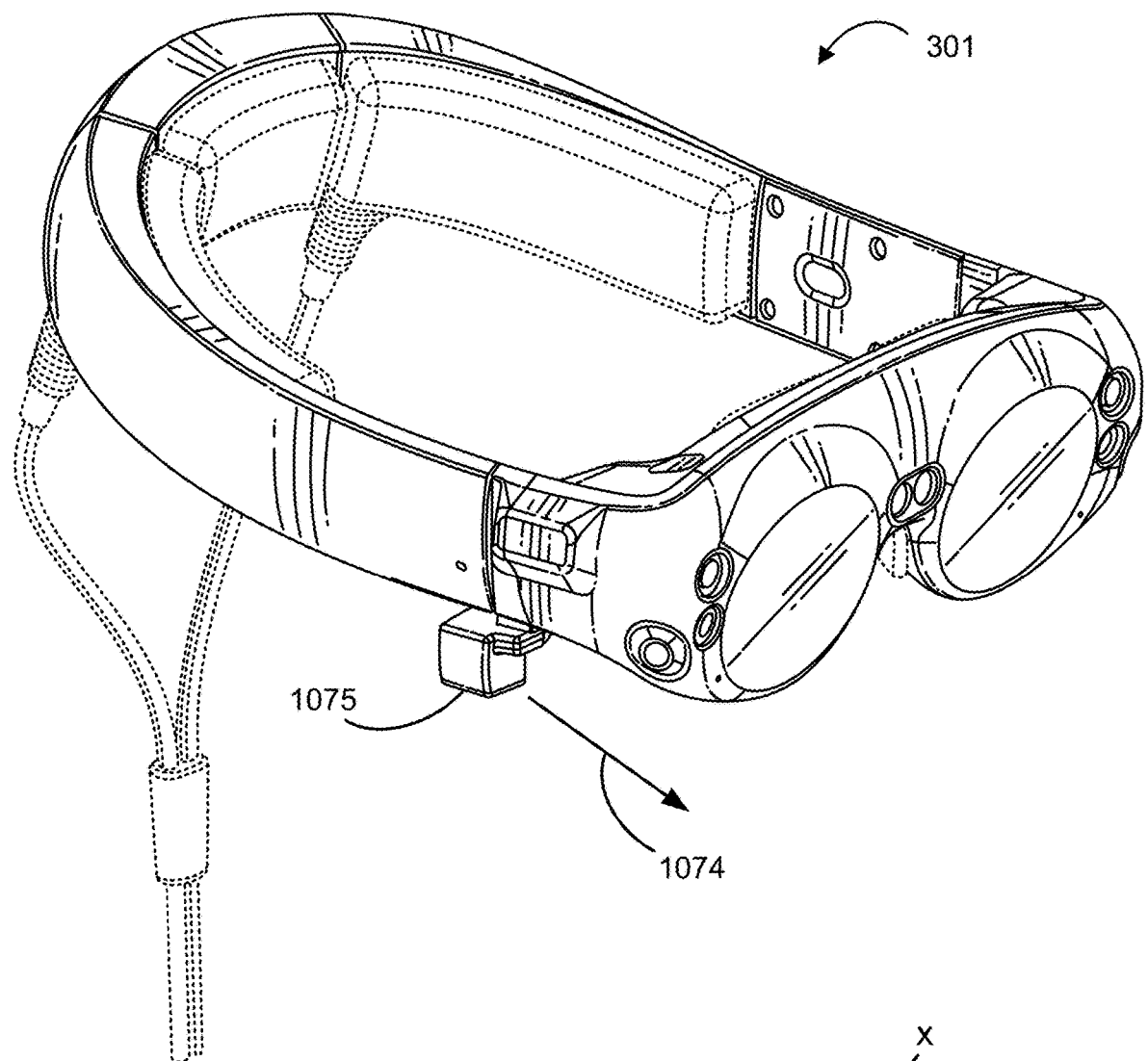
FIG. 10B is a perspective diagram illustrating integration of an electromagnetic sensor incorporating a three-sided reflector with a headset, according to some embodiments.
Figure 10B:
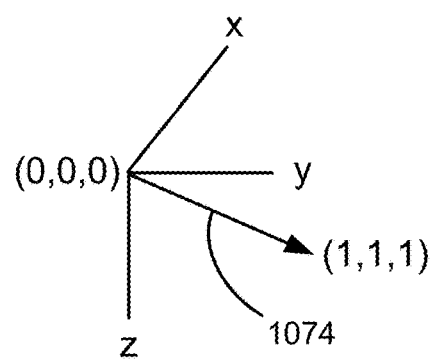
Figure 10C:
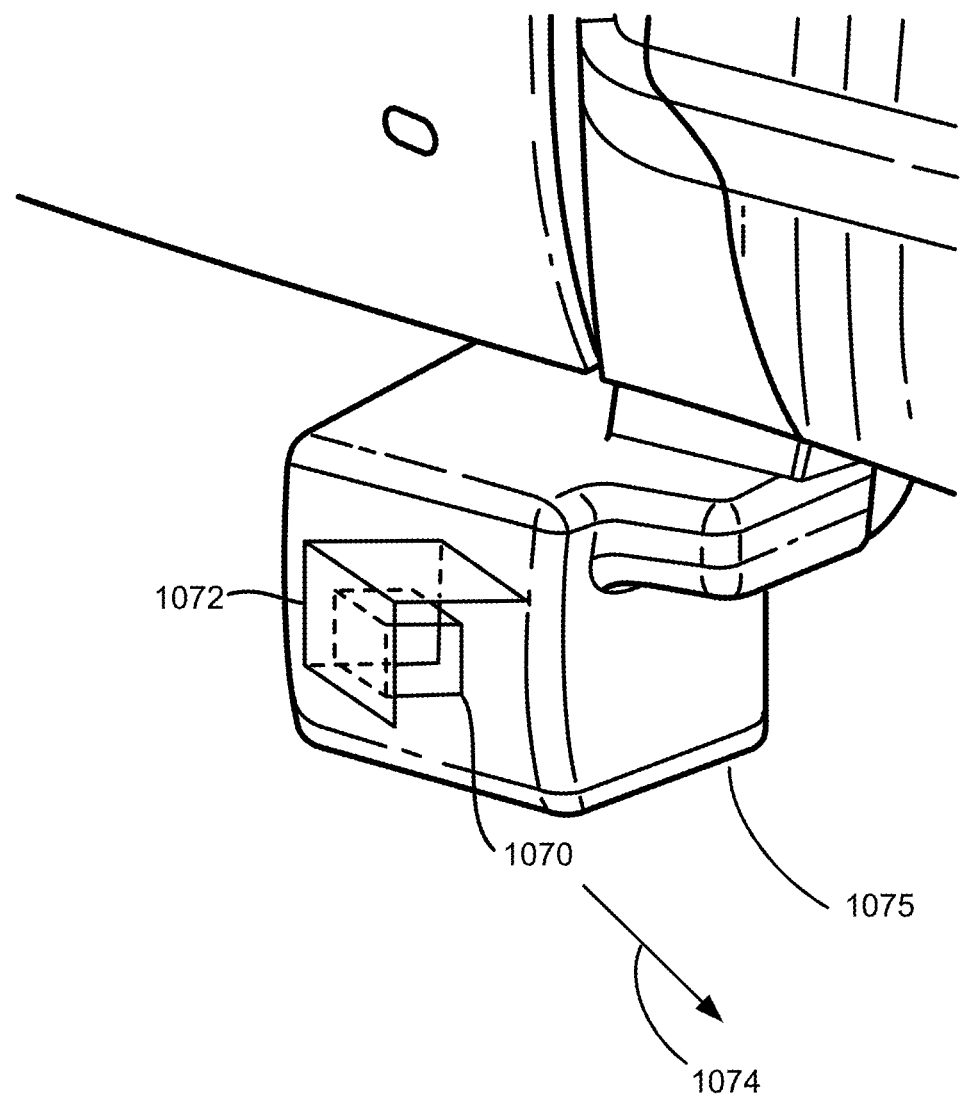
FIG. 10C is a perspective diagram illustrating an expanded view of the sensor housing illustrated in FIG. 10B.

FIG. 10B is a perspective diagram illustrating integration of an electromagnetic sensor incorporating a three-sided reflector with a headset, according to some embodiments. As illustrated in FIG. 10B, an AR headset 301 includes a sensor housing 1075 that, in some embodiments, is mounted below the right temple of the AR headset 301. FIG. 10C is a perspective diagram illustrating an expanded view of the sensor housing 1075 illustrated in FIG. 10B. The sensor housing 1075 includes an electromagnetic sensor 1070 (referred to generally as "sensor 1070") that is integrated with a three-sided corner-cube reflector 1072. Reflection, by the three-sided corner-cube reflector, of the electromagnetic field received by the sensor 1070, results in a center of a three-dimensional lobe pattern received by the sensor 1070 being aligned with a vector 1074 that is oriented along a direction pointing away from the intersection of the three reflector planes in the direction of a principal line equidistant to the three axes of the three-sided corner-cube reflector, where each axis corresponds to intersection of two reflectors. As illustrated in FIG. 10B, the vector 1074 is directed from the origin of the x-y-z coordinate space along a line directed to point (1, 1, 1) in the x-y-z coordinate space, which corresponds to the center of the three-dimensional lobe pattern. It should be noted that the x-y-z coordinate space illustrated in FIG. 10B differs from that illustrated in FIG. 10A for purposes of clarity. As illustrated in FIG. 10B, by applying three sided corner-cube reflector 1072 to the sensor 1070, it allows the sensor 1070 to sense most effectively along a principal line which would be pointed towards the emitter.

In typical use, since the hand held controller 1000 illustrated in FIG. 10A is positioned in front of and below the head of a user, the electromagnetic field received from the emitter at the sensor housing 1075 will be enhanced by the presence of three sided corner-cube reflector 1072. The position of the three sided corner-cube reflector 1072 next to the sensor 1070 results in enhanced directionality of the electromagnetic field received by the sensor 1070. As a result, increased sensitivity of the sensor along the line connecting the hand held controller 1000 and the AR headset 301 is achieved. Thus, the sensor 1070 has increased sensitivity to electromagnetic fields produced in the vicinity of the hand held controller. As a result, improved system performance is provided in relation to implementations that do not utilize reflective elements.

Figure 11:
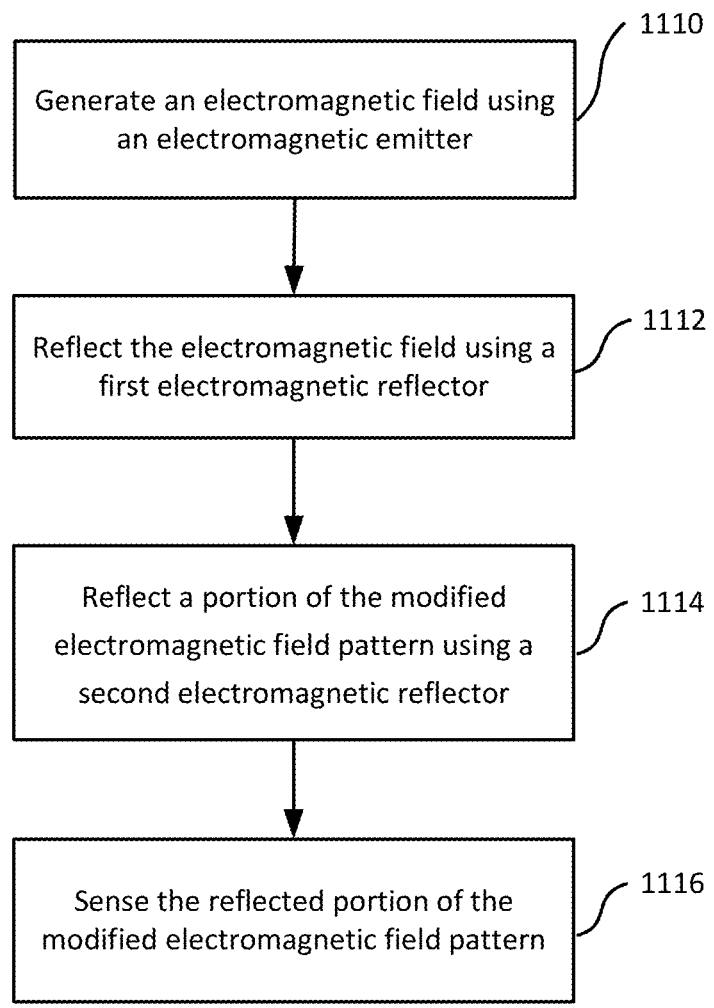
FIG. 11 is a simplified flowchart illustrating a method of operating an electromagnetic tracking system incorporating an integrated reflector according to an embodiment of the present invention.

FIG. 11 is a simplified flowchart illustrating a method of operating an electromagnetic tracking system incorporating an integrated reflector according to an embodiment of the present invention. The method 1100, in which the electromagnetic tracking system incorporates one or more integrated electromagnetic reflectors, includes, generating an electromagnetic field using an electromagnetic emitter (1100). The electromagnetic emitter can be disposed in a hand held controller that is one element of the electromagnetic tracking system, including the hand held controller, an auxiliary unit, which can include a controller, and a head mounted augmented reality display. An integrated electromagnetic reflector can be utilized with either the emitter and/or the sensor and can be any of the integrated electromagnetic reflectors illustrated in FIGS. 6-9 of the present specification.

The method also includes reflecting the electromagnetic field using a first electromagnetic reflector to form a modified electromagnetic field pattern (1112). The first electromagnetic reflector can be positioned adjacent the electromagnetic emitter. The first electromagnetic reflector can include reflective elements with various geometrical properties, including two or more reflector plates, which can be joined at an apex. In other embodiments, three reflector plates are utilized and arranged to define a corner vertex of a cube. In an alternative embodiment, the first electromagnetic reflector is formed as a single reflector element. As an example, the single reflector element can be a segmented reflector as discussed in relation to and illustrated in FIG. 7 or a hemispherical reflector as discussed in relation to and illustrated in FIG. 9.

The method further includes reflecting a portion of the modified electromagnetic field pattern using a second electromagnetic reflector (1114) and sensing the reflected portion of the modified electromagnetic field pattern using an electromagnetic sensor adjacent the second electromagnetic reflector (1116). Utilizing a controller, the method may further include controlling timing of generating the electromagnetic field and sensing the reflected portion of the modified electromagnetic field and digitally computing a position and orientation of the electromagnetic emitter and the electromagnetic sensor based on the modified electromagnetic field pattern.

It should be appreciated that the specific steps illustrated in FIG. 11 provide a particular method of operating an electromagnetic emitter incorporating an integrated reflector according to an embodiment of the present invention. Other sequences of steps may also be performed according to alternative embodiments. For example, alternative embodiments of the present invention may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A head-mounted, augmented reality display system comprising:
   a handheld controller comprising an emitter housing including:
      a first electromagnetic reflector including three first reflective elements forming a first corner vertex of a first cube, wherein the first electromagnetic reflector defines a first coordinate space and the first corner vertex of the first cube lies at the origin of the first coordinate space; and
      an electromagnetic emitter configured to produce an electromagnetic field, wherein the electromagnetic emitter is positioned along a line directed at point (1,1,1) in the first coordinate space; and a headset comprising:
- a right temple;
- a left temple; and
- a sensor housing mounted on at least one of the right temple or left temple, the sensor housing comprising:
  - an electromagnetic sensor; and
  - a second electromagnetic reflector including three second reflective elements forming a second corner vertex of a second cube.

2. The head-mounted, augmented reality display system of claim 1 wherein the first electromagnetic reflector produces a modified electromagnetic field having a lobe lying along the line directed at point (1,1,1) in the first coordinate space.

3. The head-mounted, augmented reality display system of claim 2 wherein the electromagnetic field is characterized by an initial full width half maximum width and the modified electromagnetic field is characterized by a modified full width half maximum width less than the initial full width half maximum width.

4. The head-mounted, augmented reality display system of claim 2 wherein the modified electromagnetic field is characterized by a higher field intensity at a lobe center than the electromagnetic field.

5. The head-mounted, augmented reality display system of claim 2 further comprising a controller operable to:
control timing of electromagnetic emission and sensing; and
digitally compute a position and orientation of the electromagnetic emitter and the electromagnetic sensor based on the modified electromagnetic field.

6. The head-mounted, augmented reality display system of claim 5 further comprising an auxiliary unit including the controller.

7. The head-mounted, augmented reality display system of claim 6 wherein the auxiliary unit comprises a belt pack.

8. The head-mounted, augmented reality display system of claim 6 wherein the controller is distributed between the handheld controller, the headset, and the auxiliary unit.

9. The head-mounted, augmented reality display system of claim 1 wherein the sensor housing is mounted on the right temple.

10. The head-mounted, augmented reality display system of claim 1 wherein the sensor housing is mounted on the left temple.

11. The head-mounted, augmented reality display system of claim 1 wherein the second electromagnetic reflector defines a second coordinate space, wherein the second corner vertex of the second cube lies at the origin of the second coordinate space.

12. The head-mounted, augmented reality display system of claim 11 the three second reflective elements define a quadrant of the second coordinate space in which the electromagnetic emitter is positioned.

13. The head-mounted, augmented reality display system of claim 1 wherein the three first reflective elements comprise three reflector plates and the three second reflective elements comprise three additional reflector plates.

* * * * *